United States Patent [19]

Momodomi et al.

[11] Patent Number: 4,881,113
[45] Date of Patent: Nov. 14, 1989

[54] SEMICONDUCTOR INTEGRATED CIRCUITS WITH A PROTECTION DEVICE

[75] Inventors: Masaki Momodomi; Mitsugi Ogura, both of Yokohama; Takaki Kumanomido, Kawasaki, all of Japan

[73] Assignee: Kabushiki Kaisha Toshiba, Kawasaki, Japan

[21] Appl. No.: 924,444

[22] Filed: Oct. 29, 1986

[30] Foreign Application Priority Data

Oct. 31, 1985 [JP] Japan .................................. 60-242655

[51] Int. Cl.[4] ...................... H01L 27/02; H01L 29/78; H01L 23/48; H01L 29/46
[52] U.S. Cl. ................................... 357/51; 357/23.13; 357/68; 357/71
[58] Field of Search .................. 357/68, 51, 52, 23.13, 357/53, 46

[56] References Cited

U.S. PATENT DOCUMENTS

| | | | |
|---|---|---|---|
| 3,183,576 | 5/1965 | Dill | 357/53 |
| 3,287,612 | 11/1966 | Lepselter | 357/53 |
| 3,600,648 | 8/1971 | Longo | 357/53 |
| 4,103,297 | 7/1978 | McGreivy et al. | 357/52 |
| 4,157,563 | 6/1979 | Bosselaar | 357/52 |
| 4,342,045 | 7/1982 | Kim | 357/23.13 |

FOREIGN PATENT DOCUMENTS

| | | | |
|---|---|---|---|
| 281302 | 9/1965 | Australia | 357/53 |
| 54-120587 | 9/1979 | Japan | 357/51 |
| 57-133673 | 8/1982 | Japan | 357/52 |

Primary Examiner—Rolf Hille
Assistant Examiner—Robert P. Limanek
Attorney, Agent, or Firm—Foley & Lardner, Schwartz, Jeffery, Schwaab, Mack, Blumenthal & Evans

[57] ABSTRACT

The semiconductor integrated circuit comprises a semiconductor substrate having a circuit region, a pad formed at the surface of the semiconductor substrate and forming a PN junction with the semiconductor substrate, and first and second electrodes. Each electrode contacts the semiconductor region such that the contacting regions of the electrodes face each other with a ring shaped region between.

27 Claims, 7 Drawing Sheets

SEMICONDUCTOR INTEGRATED CIRCUITS WITH A PROTECTION DEVICE

BACKGROUND OF THE INVENTION

The present invention relates to semiconductor integrated circuits having a protection device and methods for manufacturing same.

In semiconductor integrated circuits, there is a problem with electrostatic destruction. This known phenomena results in gate oxide film destruction or PN junction destruction of the inner circuit due to static electricity applied to the chip through pins of the package while in handling.

Conventionally, a signal input pad is connected to the inner circuit of an integrated circuit chip through an input protection resistor of about 1 K$\Omega$, which is made from poly-Si, and a PN junction. This protection circuit acts to lower the peak electric potential with the protection resistor, and to release electric charge buildup to the substrate with the PN junction acting as a diode. Accordingly, the voltage and the amount of charge applied to the inner circuit are reduced. However, in connection with the output pad, if a resistor having a resistivity on the order of about 1 K$\Omega$ is used, output delays occur because of the capacity of the load applied to the chip. This means that the access time of integrated circuits such as DRAMs is delayed. Hence, there is a disincentive to connect a resistor having large resistivity to the output pad. This results in a lowering of the withstand voltage, thereby leading to an increased incidence of electrostatic destruction.

FIG. 1 shows a protection device of a conventional integrated circuit. A wire 1 of Al is shown extending to the output pad and another wire 2 (Al) is connected to the inner circuit. Wires 1 and 2 each contact an n+-region 3 formed on a p−-type substrate.

The destruction described above tends to arise at the contact between Al wire 1 and n+-region 3, and especially tends to occur at the corner denoted by the reference character A. The cause is junction destruction produced by the electric field concentration.

SUMMARY OF THE INVENTION

Accordingly, an object of the present invention is to provide an improved semiconductor integrated circuit with a protection device.

Another object of the present invention is to provide an improved semiconductor integrated circuit having a high electrostatic withstand voltage.

Another object of the present invention is to provide an improved method of manufacturing semiconductor integrated circuits with a protection device.

In accomplishing the foregoing objects, there is provided according to one aspect of this invention a semiconductor integrated circuit, comprising:

a semiconductor substrate having a circuit region thereon;

a pad means formed on the semiconductor substrate;

a semiconductor region, formed at the surface of the semiconductor substrate and forming a PN junction with the semiconductor substrate;

first and second electrodes, each contacting the semiconductor region, the contacting regions of the electrodes facing each other with a ring-shaped region between;

first connection means for connecting the pad means to the first electrode; and second connection means for connecting the second electrode to the circuit region.

Furthermore, there is provided according to another aspect of the invention a method of manufacturing semiconductor integrated circuits, comprising the steps of:

forming a semiconductor region at the surface of a semiconductor substrate, the semiconductor region forming a PN junction with the semiconductor substrate;

forming first and second electrodes connected to the semiconductor region, the contacting region of the first and second electrodes facing each other with a ring-shaped region between;

providing first connection means for connecting the first electrode to a pad; and providing second connection means for connecting the second electrode to a circuit region.

BRIEF DESCRIPTION OF THE DRAWINGS

The present invention, together with its various features and advantages, will be readily understood from the following more detailed description presented in conjunction with the following drawings, in which:

FIG. 2b is a diagram showing a cross-sectional view along line A—A' of FIG. 2a;

FIGS. 3a through FIG. 3c are diagrams showing manufacturing steps for producing the device of FIG. 2a;

FIG. 5b is a diagram showing a cross-sectional view along line B—B' of FIG. 5a;

FIGS. 6a and 6b are diagrams showing manufacturing steps for producing the device of FIG. 5a;

FIG. 7 is a diagram showing a cross-sectional view of a variation of the device of FIG. 6a;

FIG. 8b is a diagram showing a cross-sectional view along line D—D' of FIG. 8a; and FIGS. 9a through 9c are diagrams showing manufacturing steps for producing the device of FIG. 8a.

DETAILED DESCRIPTION OF THE PREFERRED EMBODIMENTS

Figure 2A:
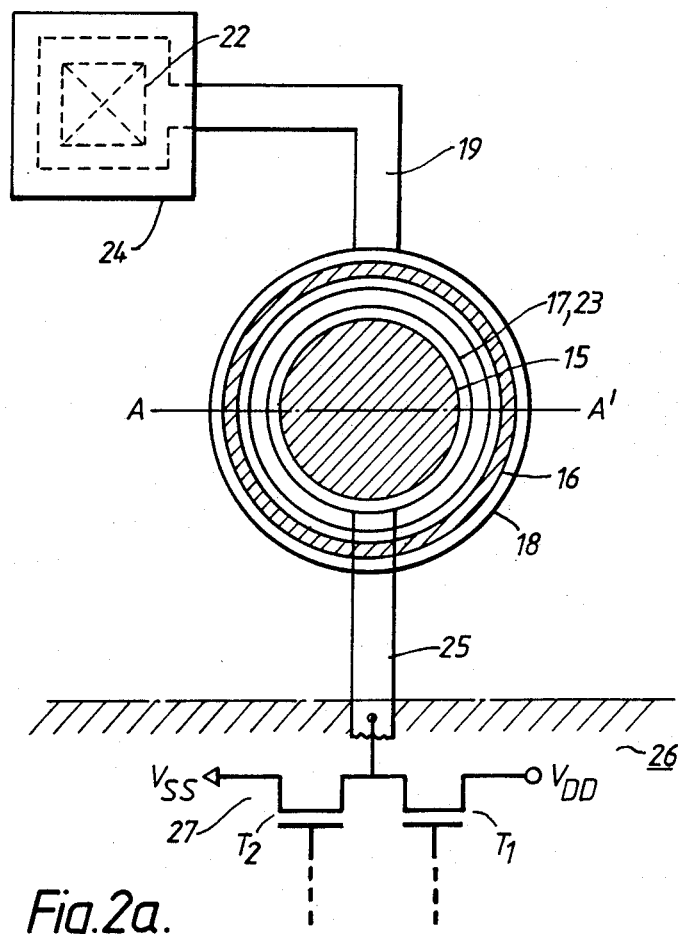
FIG. 2a is a diagram showing a plan view of a semiconductor integrated circuit of the first embodiment of the invention.
Figure 2B:
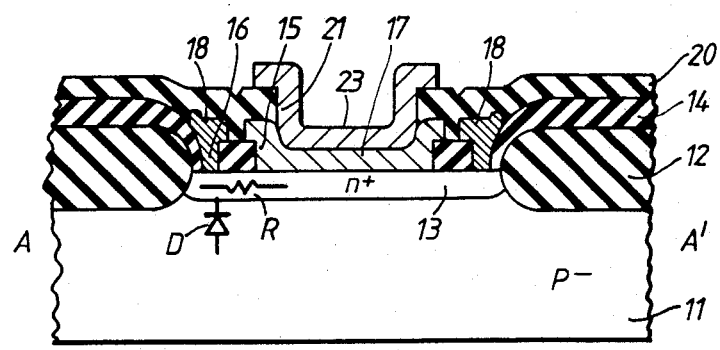

FIG. 2a is a diagram showing a plan view of a semiconductor integrated circuit of a first embodiment according to the present invention. FIG. 2b is a diagram showing a cross-sectional view along line A—A' of FIG. 2a.

At the surface region of a p−-type Si substrate 11 surrounded by a field oxide layer 12, an n+-type region 13 is formed. A CVD SiO$_2$ layer 14 is deposited on the substrate. A round-shaped contact hole 15 and a ring-shaped contact hole 16 are formed in the SiO$_2$ layer 14.

A round electrode 17 and a ring-shaped electrode 18, made from Al layers on a first level, make contact with the n+-type region 13 through the contact holes 15 and 16, respectively. The electrodes 17 and 18 face each other with a ring-shaped SiO2 region in between. A pad wire 19 is made from an extending portion of the ring-shaped electrode 18. Further, a round-shaped contact hole 21 and a pad contact hole 22 are opened through a covering CVD SiO2 layer 20 and a round electrode 23 and a bonding pad 24 made from Al layers on a second level are formed in the openings 21 and 22, respectively. A connection wire 25 is formed from an extension of electrode 23 for connection to an inner circuit region 26.

Also, FIG. 2a shows an output buffer 27. That is, in the case a high voltage is supplied to the gate of an n-channel MOSFET-T$_1$, the drain voltage V$_{DD}$ is transferred to the signal output pad 24. On the other hand, if a high voltage is applied to the gate of another n-channel MOSFET-T$_2$, the ground voltage V$_{ss}$ is transferred to the pad 24.

The radius of the round-shaped contact hole 15 is about 30 μm. On the other hand, the radius of the inner circle and the outer circle of the ring-shaped contact hole 16 are about 47 μm and 50 μm, respectively.

Figure 3A:
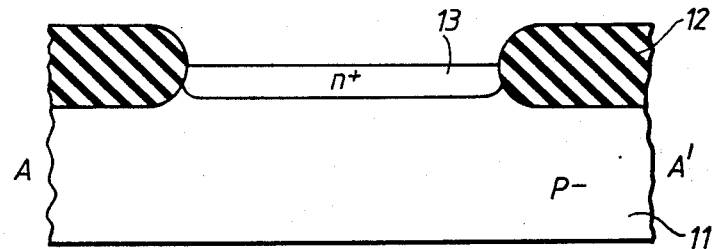
Figure 3B:
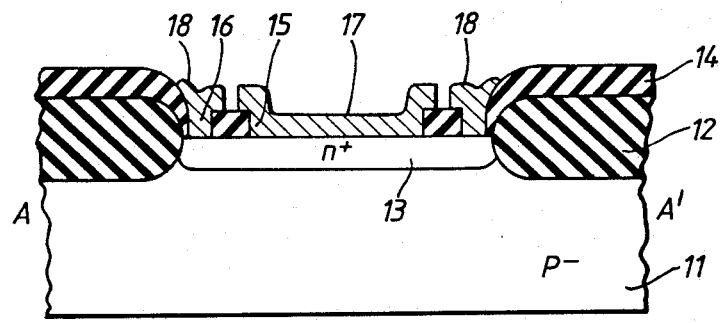
Figure 3C:
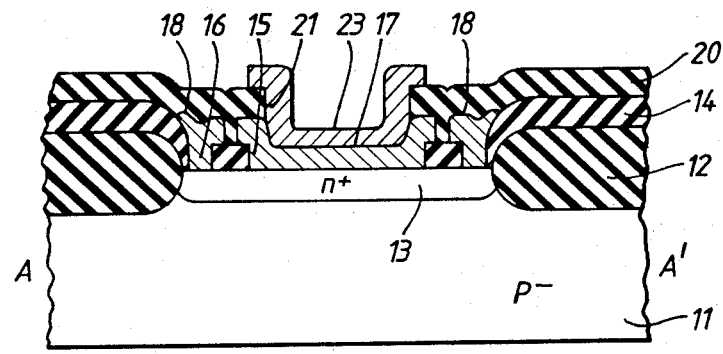

FIGS. 3a through 3c show the manufacturing steps for producing the device of FIG. 2a. As shown in these figures, at the surface of a p⁻-type Si substrate 11, a field oxide layer 12 of 0.6 μm thickness is formed. At the surface region of the Si substrate 11 surrounded by the field oxide layer 12, an n+-type region 13 is formed by As (or P) ion implantation during the same manufacturing step that the source and drain regions of MOSFETs in an inner circuit are formed. The ion implantation is performed by using the field oxide layer 12 as a mask, thus producing a round shape. This n+-type region 13 has an n-type impurity density of about $1 \times 10^{18}$ (FIG. 3a).

On the surface, a CVD SiO2 layer 14 of 0.3 μm thickness is deposited. Then, a round-shaped contact hole 15 and a ring-shaped contact hole 16 are opened. Then, a round-shaped electrode 17 and a ring-shaped electrode 18 are formed in contact with the n+-type region 13 through the contact holes 15 and 16, respectively. These electrodes 17 and 18 are made from Al layers on a first level. The ring-shaped electrode 18 has an extension over the surface of the CVD SiO2 layer 14 which forms a pad wire 19 (FIG. 2a).

A CVD SiO2 layer 20 is then deposited over the entire surface of the device. Then, a round-shaped contact hole 21 and a pad contact hole 22 (FIG. 2a) are formed. The round-shaped contact hole 21 is opened over the round-shaped electrode 17. A round-shaped electrode 23 and a bonding pad (signal output pad) 24 are respectively formed in the contact holes 21 and 22, respectively, with Al layers on a second level. The second round-shaped electrode 23 extends over the surface of the CVD SiO2 layer 20 and forms a connection wire 25 for connecting the protection device to an inner layer circuit region 26. (FIG. 2a, FIG. 3c)

The n+-type region 13 existing between the round-shaped contact hole 15 and the ring-shaped contact hole 16 acts as the resistor of the protection device as shown by the reference character R, and the PN junction forms the diode as shown by the reference character D (FIG. 2b). The protection resistor R reduces the voltage, and the diode D releases the excess electric charge to the substrate 11.

According to the embodiment described above, the contact holes 15 and 16 to which electrodes are attached are separated by the ring-shaped region. Thus, the local electric field concentration is reduced and electrostatic destruction is prevented.

In tests conducted on the device, a capacitor was charged to a high voltage and then discharged into the chip. The voltage was applied between the signal output pad and the ground voltage pad. The protection device was found to withstand voltage surges of over one thousand volts.

Figure 1:
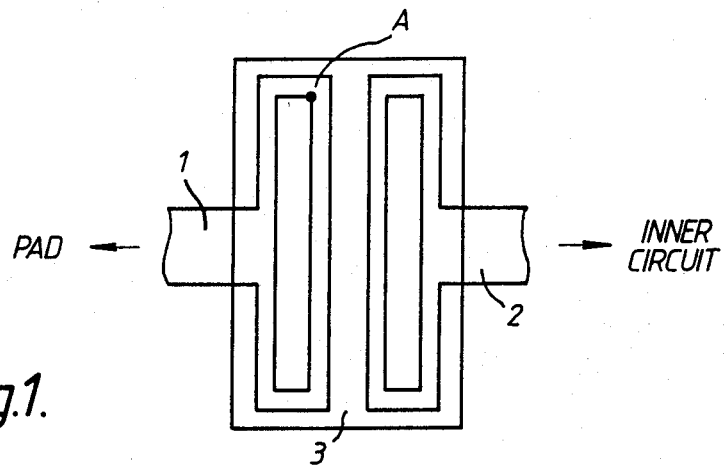
FIG. 1 shows a prior art protection device.
Figure 4A:
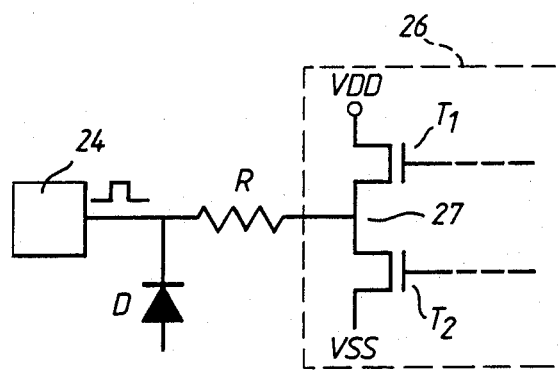
FIG. 4a is a diagram showing an equivalent circuit for the device of FIGS. 2a and 2b.

FIG. 4a is a diagram showing an equivalent circuit for the device of FIGS. 2a and 2b. In FIG. 4a, the output buffer 27 of the inner circuit region 26 is connected to the pad 24 through the protection resistor R and the diode D.

Figure 4B:
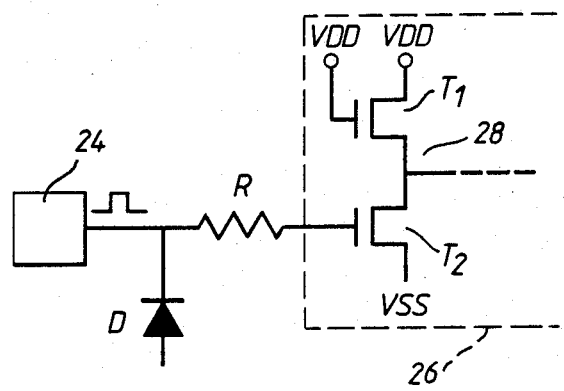
FIG. 4b is a diagram showing an equivalent circuit of a semiconductor integrated circuit having an input protection device.

If desired, this protection device may be applied also to the input circuit by using the same structure as described in FIGS. 2a and 2b. FIG. 4b is a diagram showing an equivalent circuit of a semiconductor integrated circuit having an input protection device according to the present invention. The number 28 denotes an input buffer.

Figure 5A:
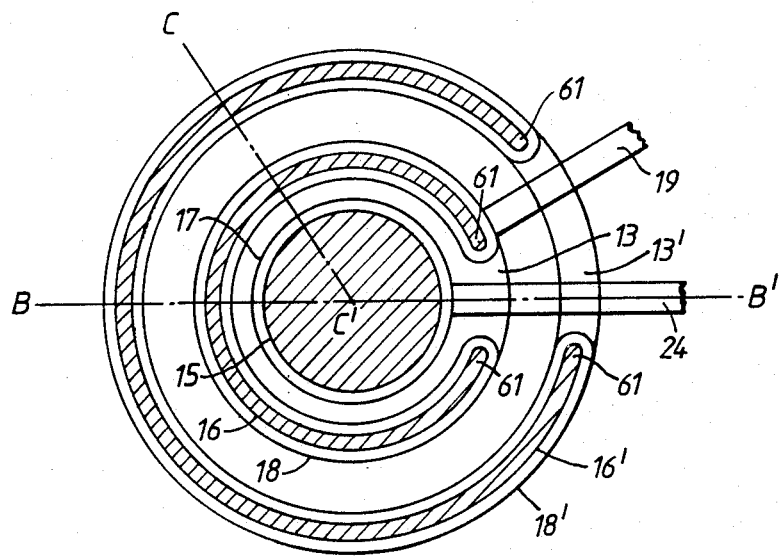
FIG. 5a is a diagram showing a plan view of a semiconductor integrated circuit of a second embodiment of the present invention.
Figure 5B:
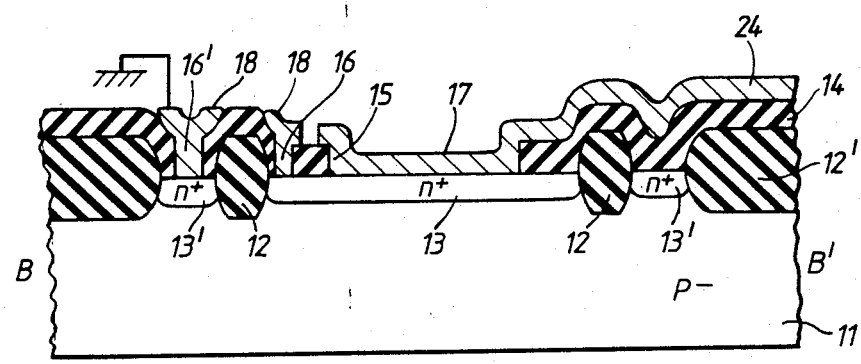

FIG. 5a is a diagram showing a plan view of a protection device of the second embodiment of the invention. FIG. 5b is a diagram showing a cross-sectional view along line B—B' of FIG. 5a. Only the protection device part is shown. The same numerals are used for the regions corresponding those of FIGS. 2a and 2b.

In this embodiment, the ring-shaped contact hole 16 and the ring-shaped electrode 18 are each broken. And, the ends of each contact are rounded. The round electrode 17 made from an Al layer on a first level is extended through the break described above. An n+-type region 13' is also formed. This structure can be manufactured using a single level Al layer.

Figure 6A:
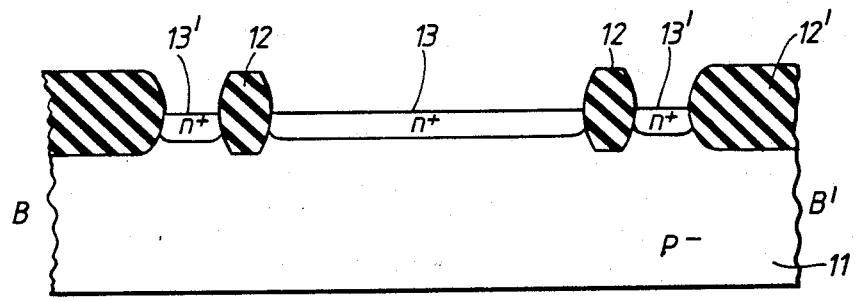
Figure 6B:
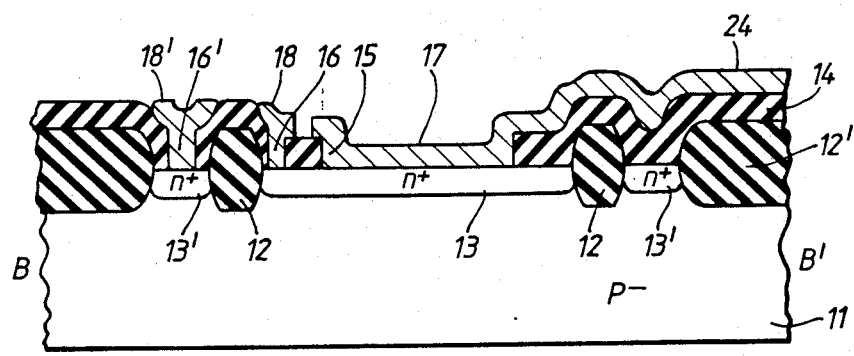

FIGS. 6a and 6b are diagrams showing the manufacturing steps for producing the device of FIG. 5a. At first, at the surface of a p⁻-type Si substrate 11, field oxide layers 12 and 12' each having a 0.6 μm thickness are formed. At the surface regions of the Si substrate 11, surrounded by the field oxide layers 12 and 12', respectively, n+-type regions 13 and 13' are formed by As (or P) ion implantation during the same manufacturing step that the source and drain regions of MOSFETs in the inner circuit are formed. The ion implantation is performed by using the field oxide layers 12 and 12' as masks, thus the n+-type region 13 is round in shape, and the other n+-type region 13' has a ring shape. The n+-type regions 13 and 13' have an n+-type impurity density of $1 \times 10^{18}$ cm$^{-3}$ (FIG. 6a).

Onto the surface, a CVD SiO2 layer 14 of 0.3 μm thickness is deposited. Then, a round-shaped contact hole 15 and a ring-shaped contact hole 16 and 16', each having a break, are opened. The contact hole 16' is opened at the ring-shaped n+-type region 13'.

The radius of the round-shaped contact hole 15 is 30 μm. The radius of the inner circle and the outer circle of the ring-shaped contact hole 16 are 47 μm and 50 μm as described in the first embodiment.

Then, a round-shaped electrode 17 and ring-shaped electrodes 18 and 18' are formed by Al layers on the same level (first level). The round-shaped electrode 17 is connected to the n+-type region 13 through the round-shaped contact hole 15, and extends over the surface of the CVD SiO2 layer 14 so as to form a pad wire 19 through the breaks of the electrodes 18 and 18'. The bonding pad may be formed as a continuous portion of the pad wire 19. The ring-shaped inner electrode 18 having a break also extends over the surface of the CVD SiO$_2$ layer 14 to form a connection wire 24 connected to the inner circuit. Also, the ring-shaped electrode 18', having a break and connected to the n$^+$-type region 13', extends over the surface of the CVD SiO$_2$ layer 14 and is connected to a V$_{ss}$ pad of the chip (not shown).

Also, according to this second embodiment, the contact regions each corresponding the round-shaped contact hole 15 and the ring-shaped contact hole 16 face each other with a ring-shaped region between. And, both ends of the ring-shaped contact hole 16 are rounded as shown at 61. Therefore, the local electric field concentration is reduced. If static electricity is applied to the output pad, and if a positive charge enters, the current flows toward the n$^+$-type region 13' (if minus charge enters, the current flows from the n$^+$-type region 13') uniformly.

It is preferable to absolutely equalize the area of the n$^+$-type region 13 (S$_1$) and the n$^+$-type region 13' (S$_2$) for balancing the effect for the positive charge and the negative charge. For example, it is preferable to design the ratio of the areas S$_2$/S$_1$ 1±0.2.

Figure 7:
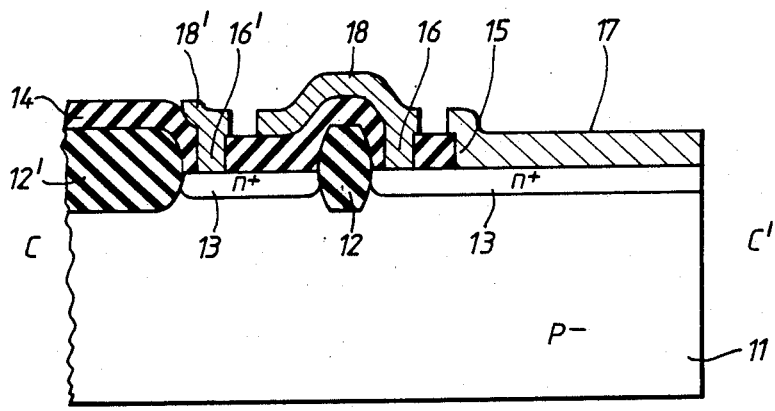

FIG. 7 is a diagram showing a cross-sectional view of a variation of the device shown in FIG. 5a. In this embodiment, the outer edge of the ring-shaped electrode 18 connected to the n$^+$-region 13 is extended over the field oxide layer 12 and is positioned above the outer n$^+$-type region 13'. The extended portion forms a MOS transistor having a source 13', a drain 13 and a gate electrode 18. This transistor forms a channel in case excess voltage is applied to the output pad. When excess positive voltage is applied to the pad, the transistor turns on, thus allowing current to flow toward the n$^+$-type region 13'. Also, in this embodiment, the ratio of areas S$_2$/S$_1$ should be 1±0.2.

Figure 8A:
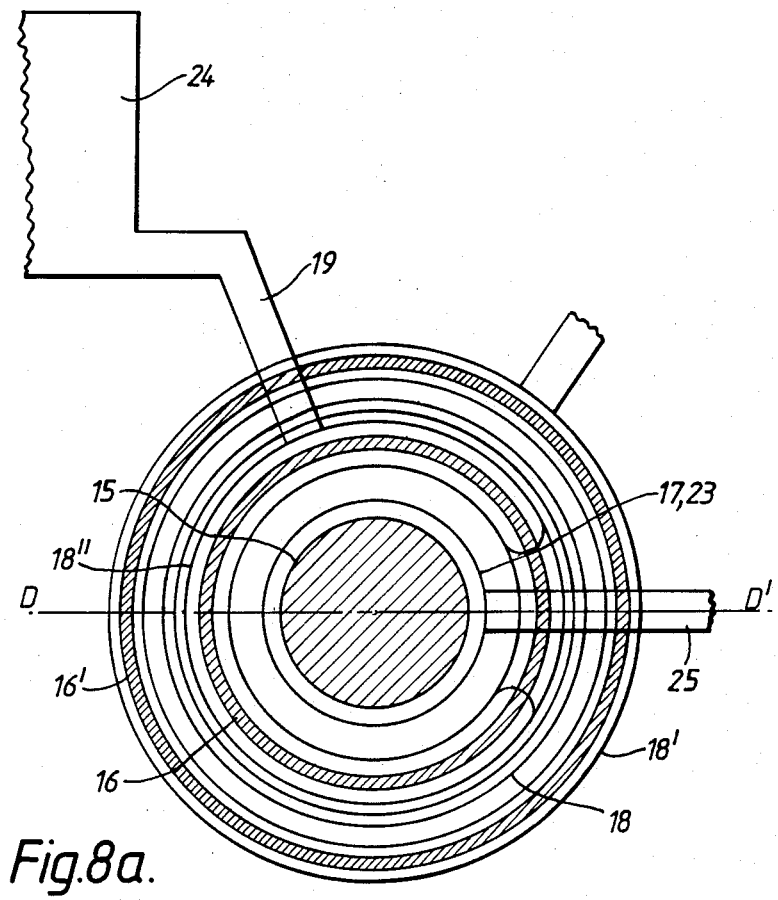
FIG. 8a is a diagram showing a plan view of a protection device according to a third embodiment of the present invention.
Figure 8B:
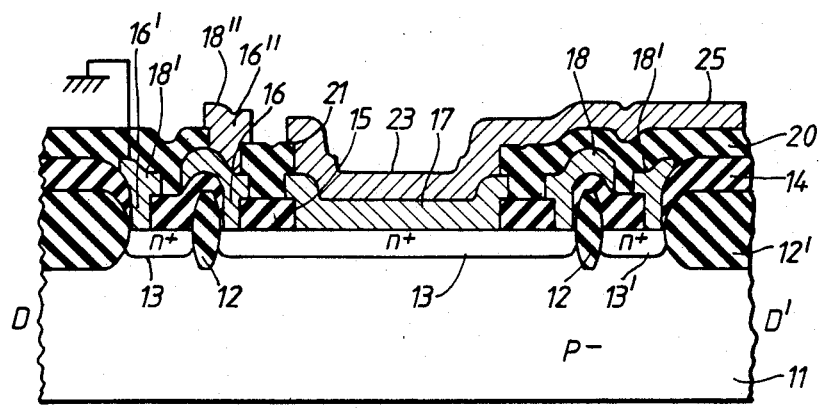

FIG. 8a is a diagram showing a plan view of a protection device of the third embodiment. FIG. 8b is a diagram showing a cross-sectional view along line D—D' of FIG. 8a. In this embodiment, the ring-shaped contact holes 16 and 16' have no break, and the ring-shaped electrodes 18 and 18', each made from an Al layer on a first level together with the round-shaped electrode 17, contact the n$^+$-type regions 13 and 13', respectively. Furthermore, a round-shaped electrode 23 contacts the round-shaped electrode 17 and extends over the surface of the CVD SiO$_2$ layer 20 through the break of a ring-shaped electrode 18" to form a connection wire 25 to the inner circuit. The ring-shaped electrode 18" is extended to form the pad wire 19 and the signal output pad 24.

Figure 9A:
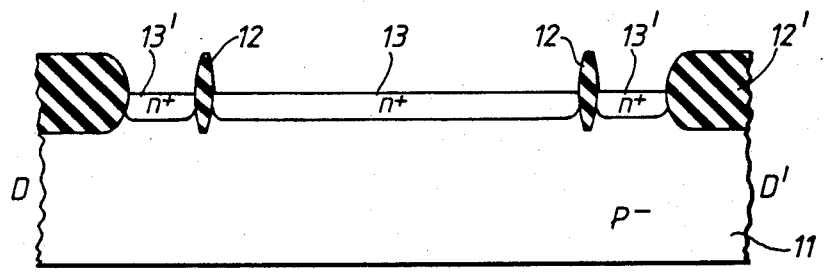
Figure 9B:
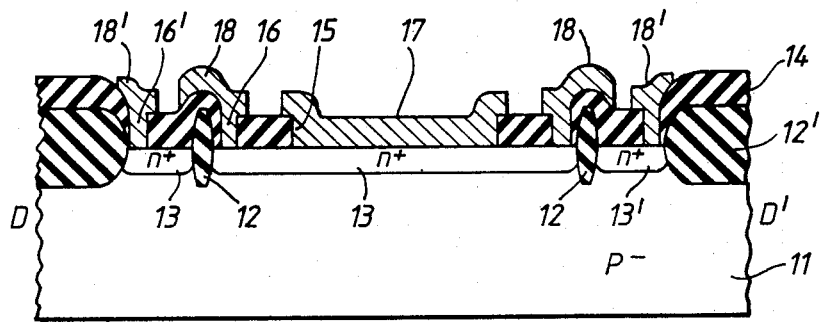
Figure 9C:
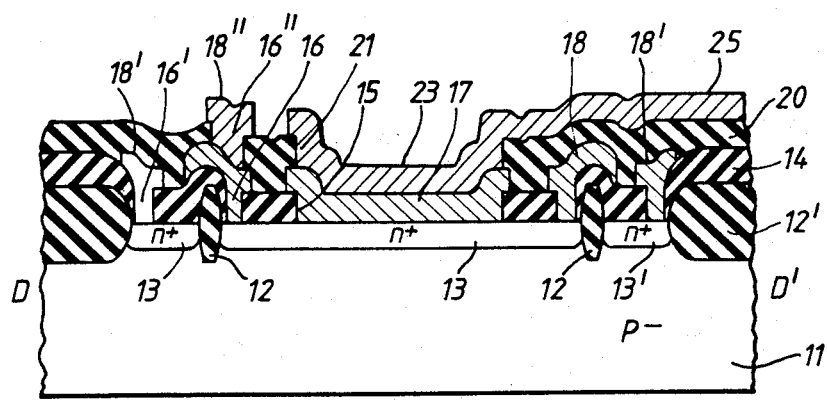

FIGS. 9a through 9c are diagrams showing the manufacturing steps for producing the device of FIG. 8a. The first step, shown in FIG. 9a, is the same as that shown in FIG. 6a, discussed above. In this embodiment, the gap between the n$^+$-regions 13 and 13' is about 3 μm. After formation of these regions, onto the surface, a CVD SiO$_2$ layer 14 of 0.3 μm thickness is deposited. Then, a round-shaped contact hole 15 and a ring-shaped contact hole 16 and 16" with no break are opened. The radius of the round-shaped contact hole 15 is 30 μm. The radius of the inner circle and the outer circle of the ring-shaped contact hole 16 are about 47 μm and 50 μm, respectively.

Then, a round-shaped electrode 17 and ring-shaped electrodes 18 and 18" with no break are formed from Al layers in a first level. The ring-shaped electrode 18' extends over the CVD SiO$_2$ layer 14 and is connected to the V$_{ss}$ pad described in the second embodiment. The inner ring-shaped electrode 18 extends over the field oxide layer 12, thus forming a transistor. (FIG. 9b)

Then, onto the entire surface, a CVD SiO$_2$ layer 20 is deposited. A round-shaped contact hole 21 and a ring-shaped contact hole 16" are formed. The ring-shaped contact hole 16" is opened above the inner ring-shaped electrode 18 and has a break. At the break, both ends of the ring-shaped electrode are rounded. Then, a round-shaped electrode 23 and a ring-shaped electrode 18" are formed through the contact holes 21 and 16", respectively. The ring-shaped electrode 18" has a break and extends over the surface of the CVD SiO$_2$ layer 20 to form a pad wire 19 and an output pad 24. The round-shaped electrode 23 extends over the surface of the CVD SiO$_2$ layer 20 as a connection wire 25 to the inner circuit.

This invention is not restricted to the embodiments described above. For instance, if desired, these protection devices may also be applied to the side of a signal input pad with no changes as described in the first embodiment. Furthermore, in the second embodiment, the inner ring-shaped contact hole 16 has a break. However, by making the round-shaped electrode 17 as a stacked electrode structure, the ring-shaped contact hole 16 may be formed with no break in the same manner as shown in FIG. 2a and FIG. 2b.

Further, other materials such as Mo, W and so forth can be used instead of Al for the electrodes in each embodiment.

Further, in the embodiments, the n$^+$-type region 13 is supplied with a ground voltage through a V$_{ss}$ pad. However, the configuration of the present invention is also effective if the ground voltage is not actually applied to the V$_{ss}$ pad. This is because the V$_{ss}$ pad, to which n$^+$-type region 13 is connected, also supplies the ground voltage to other n$^+$-type regions in the inner circuit region through V$_{ss}$ wires. Thus, charges entering the output pad will be dispersed through n$^+$-type region 13' adjoining the n$^+$-type region 13 to the entire chip.

Besides, in the embodiments described above, the potential of the substrate may be 0V, floating or at a substrate bias voltage such as −3V generated with a substrate bias generator in the chip.

Furthermore, this invention is also effective against destruction during the chip action.

Other modifications and improvements of the invention will also become apparent to those of skill in the art, and the invention is intended to cover such modifications and improvements as defined by the appended claims.

What is claimed is:

1. A semiconductor integrated circuit device, comprising:
   a semiconductor substrate having a circuit region thereon;
   a pad means formed on said semiconductor substrate;
   a first semiconductor region of one conductivity type, formed at the surface of said semiconductor substrate and forming a PN junction with said semiconductor substrate;
   first and second electrodes, each contacting said first semiconductor region, the contacting regions of said electrodes facing each other with a ring-shaped region between;

first connection means for connecting said pad means to said first electrode; and second connection means for connecting said second electrode to said circuit region.

2. A semiconductor integrated circuit as claimed in claim 1, further comprising:

a first insulating layer formed on said semiconductor substrate, and having a round-shaped contact hole and a ring-shaped contact hole formed concentrically around said round-shaped contact hole;

wherein said first electrode contacts said first semiconductor region through said ring-shaped contact hole, and said second electrode contacts said first semiconductor region through said round-shaped contact hole.

3. A semiconductor integrated circuit as claimed in claim 2, further comprising:

a second insulating layer having a contact hole disposed over said second electrode;

wherein one of said first and second connection means comprises a third electrode connected to said second electrode through said contact hole in said second insulating layer, and a wire connected to said third electrode and extending over the surface of said second insulating layer.

4. A semiconductor integrated circuit as claimed in claim 1, wherein said first electrode surround said second contact electrode.

5. A semiconductor integrated circuit device, comprising:

a semiconductor substrate having a circuit region thereon;

a pad means formed on said semiconductor substrate;

a first semiconductor region formed at the surface of said semiconductor substrate and forming a PN junction with said semiconductor substrate;

first and second electrodes, each contacting said first semiconductor region, the contacting regions of said electrodes facing each other with a ring-shaped region between;

first connection means for connecting said pad means to said first electrode; and second connection means for connecting said second electrode to said circuit region, wherein said first semiconductor region is round and further including a second semiconductor region having a ring-shaped and being formed around said first semiconductor region, said second semiconductor region having the same conductivity as said first semiconductor region, and being a ground voltage semiconductor region.

6. A semiconductor integrated circuit as claimed in claim 5, further comprising:

a first field insulating layer formed between said second semiconductor region and said first semiconductor region; and a second field insulating layer surrounding said second semiconductor region.

7. A semiconductor integrated circuit as claimed in claim 5, further comprising:

an insulating layer formed on said semiconductor substrate and having a round-shaped contact hole and a ring-shaped contact hole formed concentrically around said round-shaped contact hole, said round-shaped contact hole being formed over said first semiconductor region;

wherein said first electrode contacts said first semiconductor region at said ring-shaped contact hole, and the second electrode is connected to said first semiconductor region through said round-shaped contact hole.

8. A semiconductor integrated circuit as claimed in claim 7, wherein said first electrode has a break, and said second electrode extends over the surface of said insulating layer through said break.

9. A semiconductor integrated circuit as claimed in claim 8, further comprising:

a third electrode having a ring shape with a break and contacting said ring-shaped semiconductor region;

wherein said insulating layer further has a ring-shaped contact hole having a break and corresponds in shape to said third electrode.

10. A semiconductor integrated circuit as claimed in claim 7, wherein the outer edge of said first electrode is positioned above said ring-shaped semiconductor region; and including a second insulating layer having a second round-shaped contact hole and a second ring-shaped contact hole formed concentrically around said second round-shaped contact hole, said second ring-shaped contact hole having a break;

wherein one of said first and second connection means comprises a further ring shaped electrode having a break and formed in said second ring-shaped contact hole and a wire extending from said further ring-shaped electrode, and the other of said first and second connection means comprises a further round-shaped electrode formed in said second round-shaped contact hole and a wire extending from said further round-shaped electrode through said break of said further ring-shaped electrode.

11. A semiconductor integrated circuit as claimed in claim 5, wherein said first electrode surrounds said second electrode.

12. A semiconductor integrated circuit as claim in claim 7, wherein said ring-shaped contact hole has a break, and has rounded ends.

13. A semiconductor integrated circuit as claimed in claim 5, wherein the ratio of the area of the ring-shaped semiconductor region ($S_2$) to the area of the round-shaped semiconductor ($S_1$) is set at $S_2/S_1 = 1 \pm 0.2$.

14. A semiconductor integrated as claimed in claim 1, wherein said pad means is signal output pad means.

15. A semiconductor integrated circuit as claimed in claim 5, wherein said pad means is a signal pad means.

16. A semiconductor integrated circuit as claimed in claim 15, wherein said pad means is a signal output pad means.

17. A semiconductor integrated circuit device, comprising;

a semiconductor substrate having a circuit region thereon;

a signal pad means formed on said semiconductor substrate;

a first semiconductor region of one conductivity type, formed at the surface of said semiconductor substrate and forming a PN junction with said semiconductor substrate, said first semiconductor region being round in shape;

first and second electrodes, each contacting said first semiconductor region, the contacting regions of said electrodes facing each other with a ring-shaped region between said first electrode configured to surround said second electrode;

first connection means for connecting said pad means to said first electrode; and second connection means for connecting said second electrode to said circuit region, wherein said signal pad means is an output signal pad means, said circuit region including an output buffer, and said output buffer is connected to said second electrode with said second connection means.

18. A semiconductor integrated circuit as claimed in claim 17, further comprising:

a first insulating layer formed on said semiconductor substrate, and having a round-shaped contact hole and a ring-shaped contact hole formed concentrically around said round-shaped contact hole;

wherein said first electrode contacts said first semiconductor region through said ring-shaped contact hole, and said second electrode contacts said first semiconductor region through said round-shaped contact hole.

19. A semiconductor integrated circuit as claimed in claim 18, further comprising:

a second insulating layer having a contact hole disposed over said second electrode;

wherein said second connection means comprises a third electrode connected to said second electrode through said contact hole in said second insulating layer, and a wire connected to said third electrode and extending over the surface of said second insulating layer.

20. A semiconductor integrated circuit device, comprising:

a semiconductor substrate having a circuit region thereon;

a signal pad means formed on said semiconductor substrate;

a first semiconductor region of one conductivity type, formed at the surface of said semiconductor substrate and forming a PN junction with said semiconductor substrate, said first semiconductor region being round in shape;

first and second electrodes, each contacting said first semiconductor region, the contacting region of said electrodes facing each other with a ring-shaped region between said first electrode configured to surround said second electrode;

first connection means for connecting said pad means to said first electrode; and second connection means for connecting said second electrode to said circuit region;

wherein said signal pad means is an input signal pad means, said circuit region including an input buffer, and said input buffer is connected to said second electrode with said second connection means.

21. A semiconductor integrated circuit as claimed in claim 20, further comprising:

a first insulating layer formed on said semiconductor substrate, and having a round-shaped contact hole and a ring-shaped contact hole formed concentrically around said round-shaped contact hole;

wherein said first electrode contacts said first semiconductor region through said ring-shaped contact hole, and said second electrode contacts said first semiconductor region through said round-shaped contact hole.

22. A semiconductor integrated circuit as claimed in claim 21, further comprising:

a second insulating layer having a contact hole disposed over said second electrode;

wherein said second connection means comprises a third electrode connected to said second electrode through said contact hole in said second insulating layer, and a wire connected to said third electrode and extending over the surface of said second insulating layer.

23. A semiconductor integrated circuit device, comprising:

a semiconductor substrate having an inner circuit thereon;

a signal pad means formed on said semiconductor substrate;

a first semiconductor region of one conductivity type, formed at the surface of said semiconductor substrate and forming a PN junction with said semiconductor substrate, said first semiconductor region being round in shape;

first and second electrodes, each contacting said first semiconductor region, the contacting regions of said electrodes facing each other with a ring-shaped region between said first electrode configured to surround said second electrode;

first connection means for connecting said pad means to said first electrode;

second connection means for connecting said second electrode to said inner circuit region; and a second semiconductor region having a ring-shape and being formed around said first semiconductor region, said second semiconductor region having the same conductivity as said first semiconductor region, and being a ground voltage semiconductor region.

24. A semiconductor integrated circuit as claimed in claim 23, wherein said signal pad means is an output signal pad means, said inner circuit including an output buffer, and said output buffer is connected to said second electrode with said second connection means.

25. A semiconductor integrated circuit as claimed in claim 23, wherein said signal pad means is an input signal pad means, said inner circuit including an input buffer, and said input buffer is connected to said second electrode with said second connection means.

26. A semiconductor integrated circuit as claimed in claim 23, wherein said second semiconductor region is a grounded region.

27. A semiconductor integrated circuit as claimed in claim 23, wherein said second semiconductor region is a region to be grounded in circuit operation.

* * * * *